(12) United States Patent
Singh et al.

(10) Patent No.: US 9,106,219 B2
(45) Date of Patent: Aug. 11, 2015

(54) IMPEDANCE CALIBRATION CIRCUIT AND METHOD

(71) Applicant: STMICROELECTRONICS INTERNATIONAL N.V., Amsterdam (NL)

(72) Inventors: Mayank Kumar Singh, Noida (IN); Daljeet Kumar, New Delhi (IN); Hiten Advani, New Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 12 days.

(21) Appl. No.: 14/075,272

(22) Filed: Nov. 8, 2013

(65) Prior Publication Data

US 2014/0070843 A1 Mar. 13, 2014

Related U.S. Application Data

(62) Division of application No. 13/218,134, filed on Aug. 25, 2011, now Pat. No. 8,581,619.

(51) Int. Cl.
*H04L 25/02* (2006.01)
*G11C 7/12* (2006.01)
*H03K 19/003* (2006.01)

(52) U.S. Cl.
CPC ...... *H03K 19/00346* (2013.01); *H04L 25/0278* (2013.01); *H04L 25/0298* (2013.01)

(58) Field of Classification Search
CPC .......... H04L 25/0278; H04L 25/0298; H03K 19/0005; H03K 19/00361; H03K 19/00384; H03K 5/12; G11C 7/1051; G11C 7/1078; G11C 7/22; G11C 7/12; G11C 5/145; G11C 8/08
USPC ..................... 326/30; 327/108, 170, 172–176; 365/189.05, 189.11; 710/106
See application file for complete search history.

(56) References Cited

U.S. PATENT DOCUMENTS

| 5,438,699 | A | * | 8/1995 | Coveley ..................... 455/67.14 |
| 6,157,206 | A | * | 12/2000 | Taylor et al. .................... 326/30 |
| 6,392,446 | B1 | | 5/2002 | Reasoner et al. |
| 6,570,402 | B2 | | 5/2003 | Koo et al. |
| 6,573,746 | B2 | | 6/2003 | Kim et al. |
| 7,205,787 | B1 | | 4/2007 | Massoumi et al. |
| 7,991,573 | B2 | * | 8/2011 | Homer et al. ................ 702/107 |
| 7,994,573 | B2 | | 8/2011 | Pan |
| 8,581,619 | B2 | * | 11/2013 | Singh et al. .................... 326/30 |
| 2002/0050838 | A1 | | 5/2002 | Kim et al. |
| 2009/0164165 | A1 | * | 6/2009 | Homer et al. ................ 702/107 |
| 2013/0049797 | A1 | | 2/2013 | Singh et al. |

* cited by examiner

Primary Examiner — Dylan White
(74) Attorney, Agent, or Firm — Gardere Wynne Sewell LLP

(57) ABSTRACT

An embodiment includes an impedance calibration circuit having a calibrator configured to compare voltage levels at an external node and an internal node of the impedance calibration circuit and to generate an output based on the comparison. The calibrator further includes respective filters coupled between the external node and a first input of the comparator, and between the internal node and a second input of the comparator. The filters are configured for symmetric noise injection into the comparator from a chip ground line to which a programmable resistor at the internal node is coupled.

29 Claims, 12 Drawing Sheets

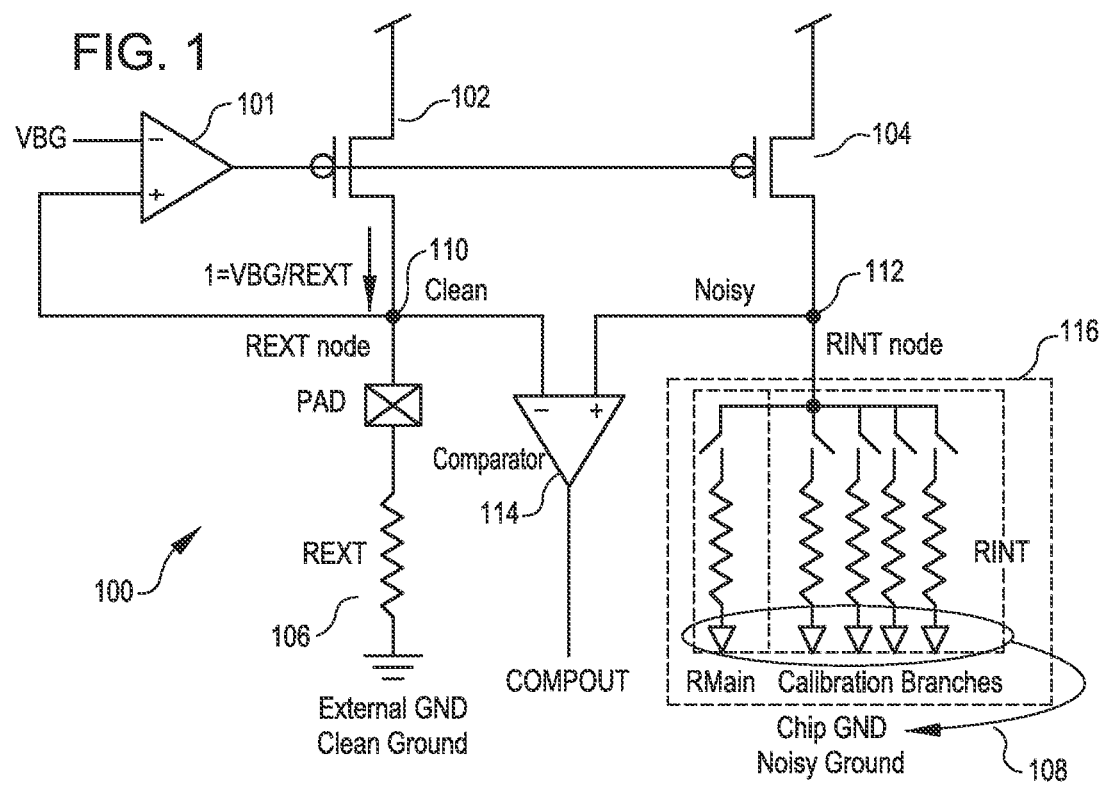

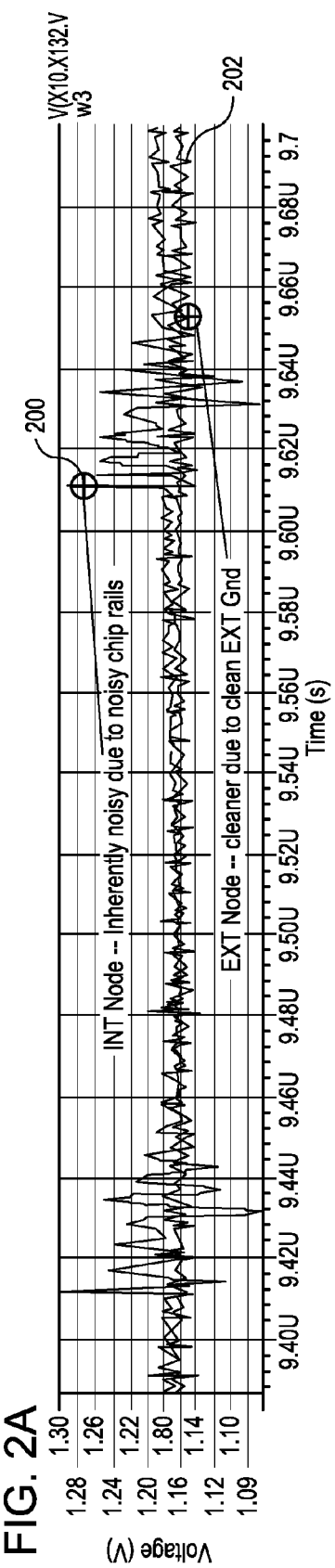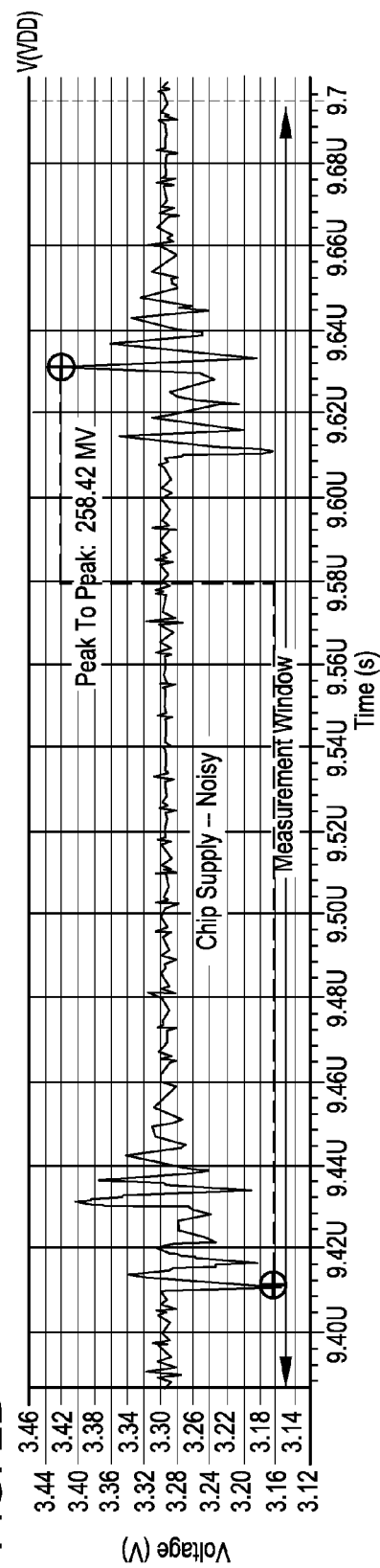
FIG. 2A
FIG. 2B

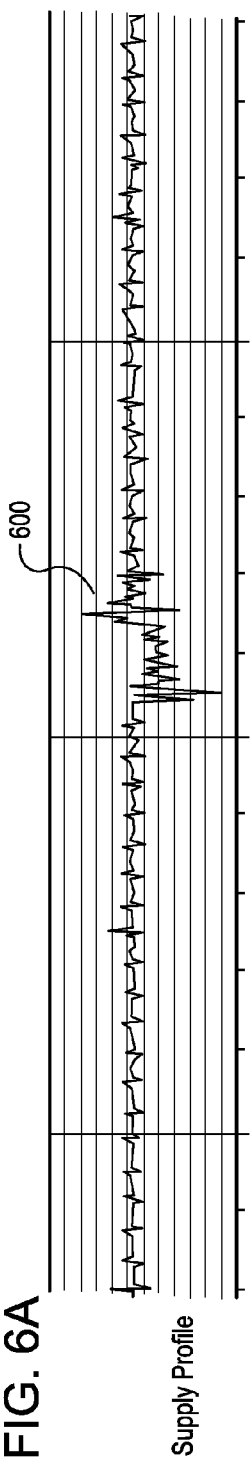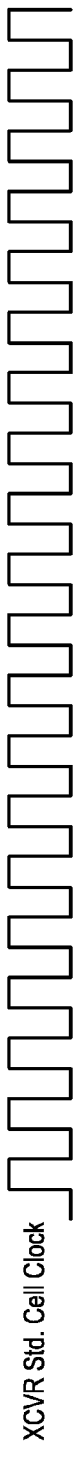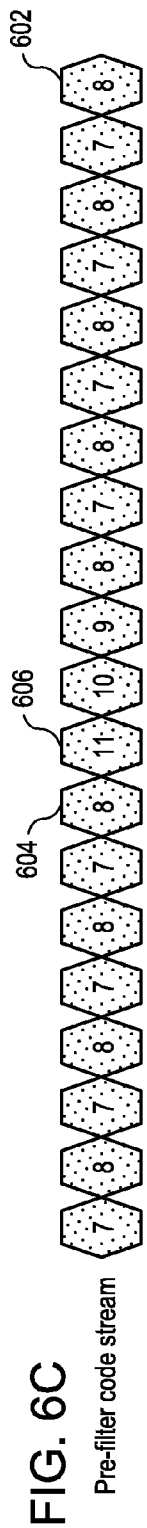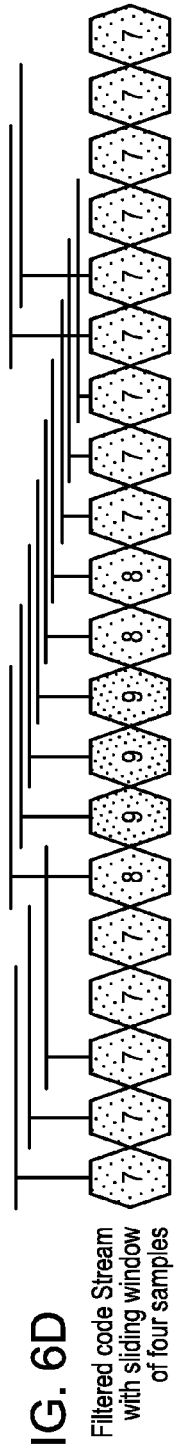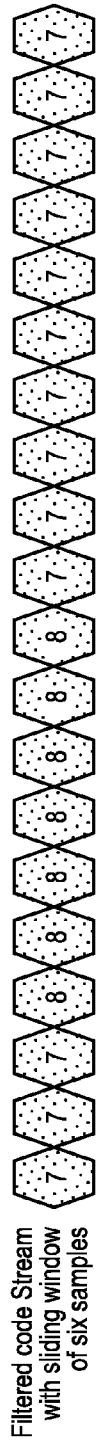
FIG. 6A Supply Profile
FIG. 6B XCVR Std. Cell Clock
FIG. 6C Pre-filter code stream
FIG. 6D Filtered code Stream with sliding window of four samples
FIG. 6E Filtered code Stream with sliding window of six samples TX Data Line Generated Calibration Codes XCVR Std. Cell Clock Latched Codes on Driver Impedance

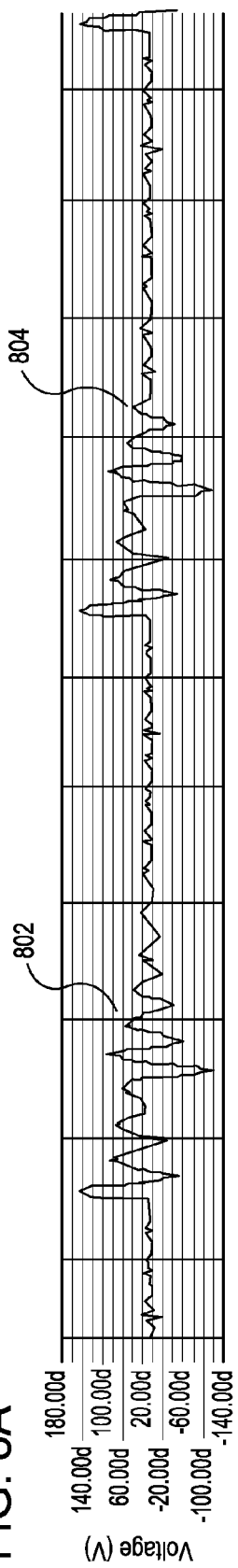
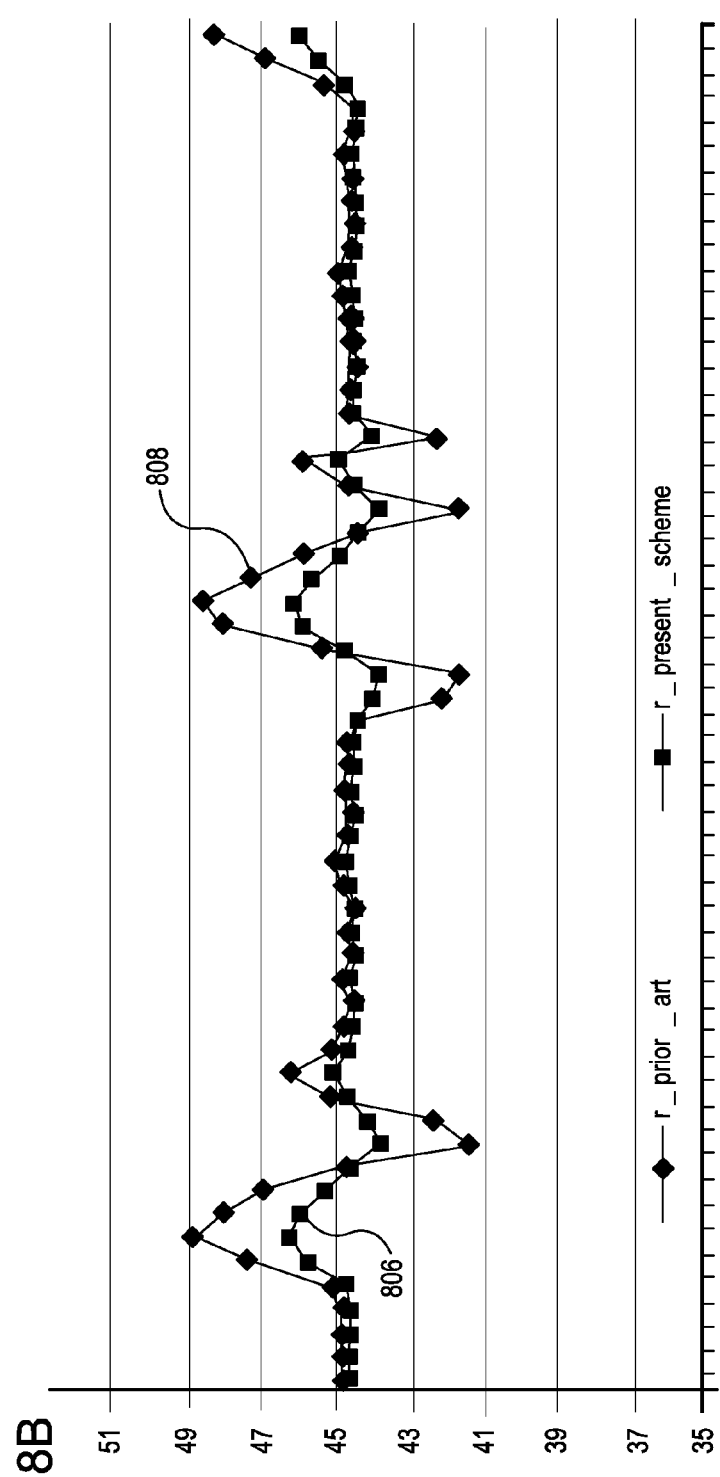
FIG. 8A
FIG. 8B

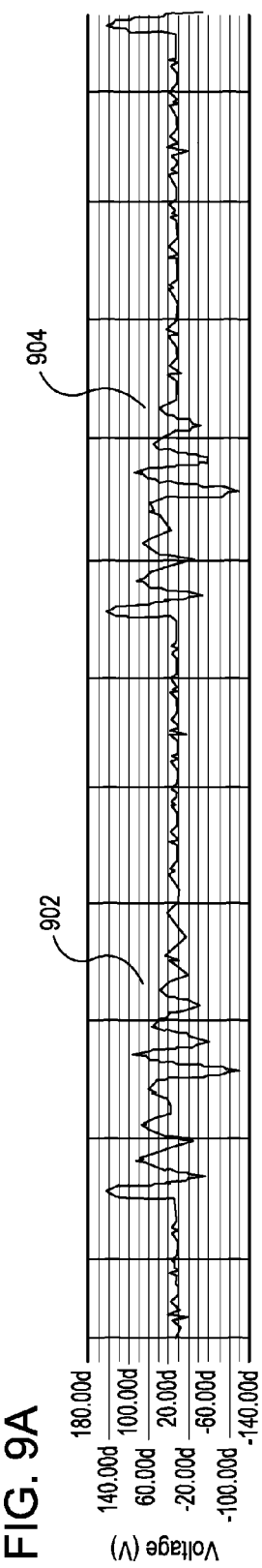
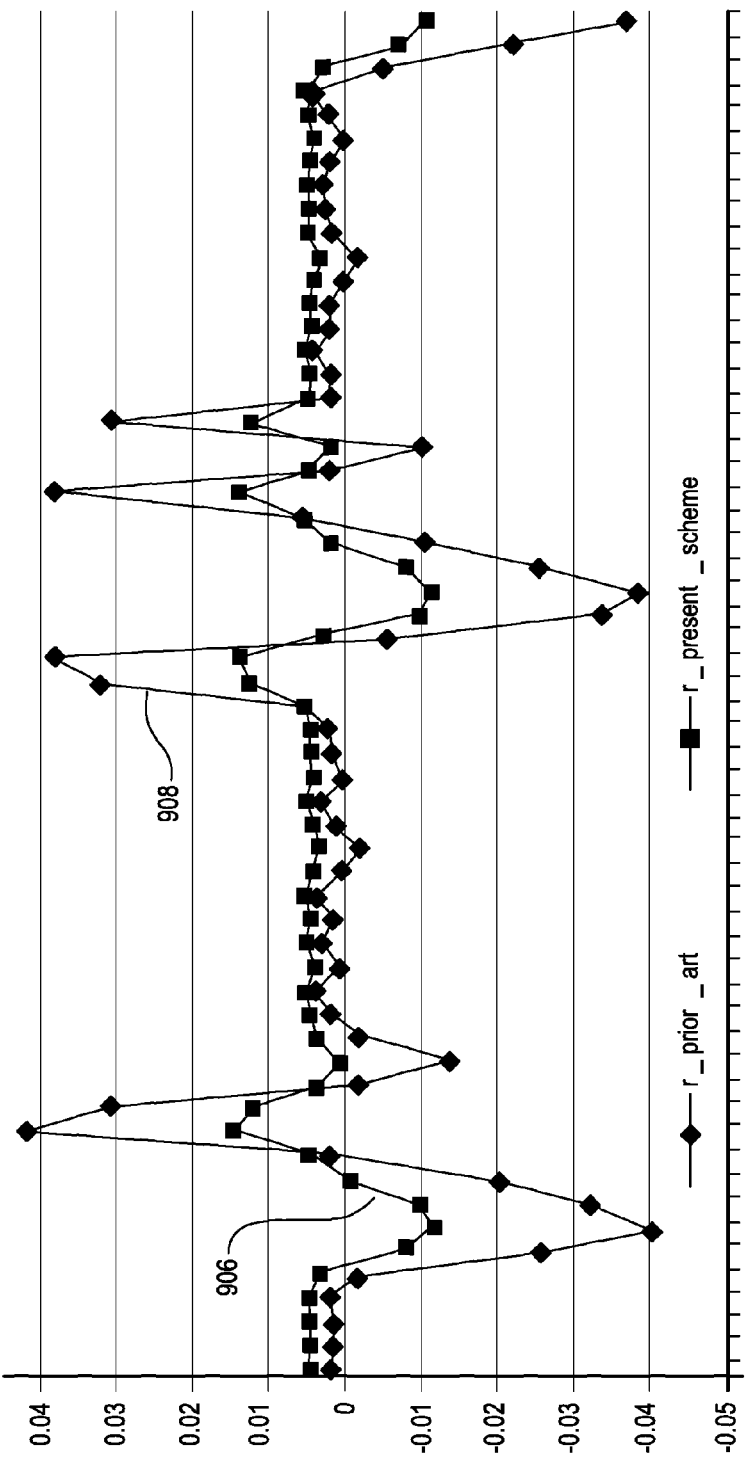

IMPEDANCE CALIBRATION CIRCUIT AND METHOD

PRIORITY CLAIM

The present application is a Divisional of copending U.S. patent application Ser. No. 13/218,134, filed Aug. 25, 2011, which application is incorporated herein by reference in its entirety.

TECHNICAL FIELD

An embodiment relates broadly to an impedance calibration circuit and method, to a device including an impedance calibration circuit, and to a transmission link system.

BACKGROUND

Impedance calibration circuits and semiconductor devices including impedance calibration circuits find application in a variety of technologies, including in avoiding/reducing impedance mismatch on signal transmission lines. As will be appreciated by a person skilled in the art, avoiding/reducing impedance mismatch is important for the power transfer efficiency of a signal transmission link. This is particularly relevant for multi-gigabyte/s rates of signal transmission, in order to preserve signal integrity. If the bit period is shorter than the flight time, as in high speed multi-gigabytes/s transmission links, echoes of previous pulses may arrive at the receiver on top of the main pulse, thus corrupting the received signal. The signal integrity may be evaluated, for example, in the degradation of the eye diagram of a signal transmission link at a given signal transmission rate. Typically, acceptable eye specification conditions are set by different transmissions standards.

One conventional impedance calibration circuit 100 is shown in FIG. 1. In the calibration circuit 100, an input from a reference voltage generator (VBG) is provided to an opamp 101, which through an analog loop forces a current VBG/REXT through transistor device 102 and precise external resistor REXT in an external ground arm 106, and this current is mirrored into transistor device 104 and an internal programmable resistor 116, which is coupled to internal chip ground, and hence called "internal" arm 108. The voltages at an REXT node and an RINT node 110, 112 respectively are provided as negative and positive inputs of a comparator 114 to generate an output signal COMPOUT to a calibration logic (not shown). The calibration logic generates calibration codes to be used in the RINT impedance calibration (programmable resistor 116), which is a scaled up version of the actual driver impedance calibration unit (not shown) to which the same calibration code is simultaneously provided. As will be appreciated by a person skilled in the art, a scaled up version of the driver impedance calibration unit is typically incorporated into the calibration circuit to avoid the large currents that would otherwise be associated with incorporating directly the actual impedance calibration unit for a typical transmission line.

The calibration scheme implemented by the impedance calibration circuit 100 may improperly calibrate the impedance that should match the characteristic impedance owing to the noise present on supply/ground lines. More particularly, this calibration scheme cannot handle a number of noise sources, including ground bounce, periodic noise, and packet start/stop noise. For example, in current-mode driver voltage-sensing high speed links, such as Universal Serial Bus (USB), large currents are dumped into the ground rail at the data rate, resulting in ground bounce. Furthermore, digital grounds may be merged with analog grounds to reduce the pin count.

Periodic noise may originate, for example, from one or more Phase Locked Loops (PLLs) employed on high speed links, or from the digital circuitry, e.g., high speed data switching, clock buffers, etc. Packet Start/Stop Noise may be associated with burst mode transmission and inter-packet delay. FIGS. 2A-2D are respective graphs illustrating the adverse effects of chip supply noise and internal chip ground noise in the above-described calibration scheme. More particularly, in FIG. 2A, the differences of the voltages at the internal and external nodes (curves 200, 202 respectively) are shown due to the internal and external ground mismatch. FIGS. 2B-2D show the chip supply, external ground, and internal chip ground corresponding signals respectively, illustrating the contributions of the chip supply noise and internal chip ground noise (i.e., Ground Bounce Noise) to the difference between the voltages at nodes 112, 110 (FIG. 1) respectively. As will be appreciated, while the supply noise and the Ground Bounce Noise appear to be of similar amplitude, their respective contributions to noise on REXT & RINT Nodes are different. The Ground Bounce Noise is coupled directly to the REXT and RINT nodes through a resistor, while the supply noise gets shaped by the analog loop and transistor devices.

SUMMARY

A need therefore exists to provide an impedance calibration circuit that seeks to address at least one of the above mentioned problems.

BRIEF DESCRIPTION OF THE DRAWINGS

One or more embodiments will be better understood from the following written description, by way of example only, and in conjunction with the drawings, in which:

FIG. 1 is a schematic diagram of a conventional impedance calibration circuit.

FIGS. 2A to 2D are respective graphs illustrating the adverse effects of chip supply noise and internal chip ground noise to the calibration circuit of FIG. 1.

FIGS. 6A to 6E are timing diagrams that illustrate the digital filtering performed by the calibration block of FIG. 5 according to an embodiment.

FIGS. 8A to 8B are respective plots of comparative results for the characteristic impedance $Z_{OH}$ variation for dynamic calibration according to a conventional scheme, compared to a scheme according to an embodiment.

FIGS. 9A to 9B are respective plots of comparative results for the reflection coefficient $r=(ZL-Z0)/(ZL+Z0)$ according to a conventional scheme, compared to a scheme according to an embodiment.

DETAILED DESCRIPTION

Figure 2C:
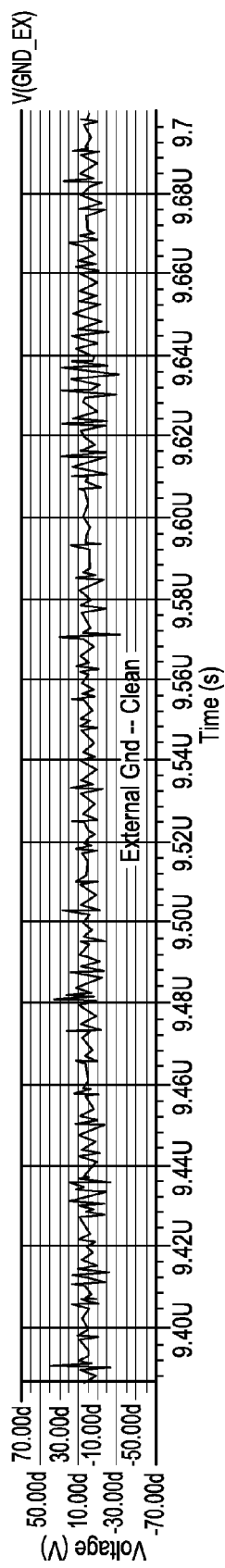
Figure 2D:
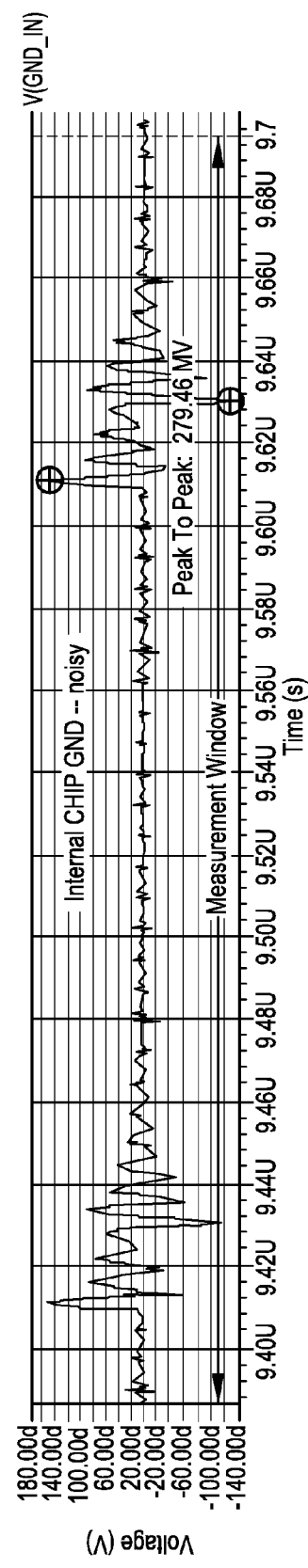

One or more embodiments may provide a complete dynamic impedance calibration scheme, built with high noise immunity against periodic/random/packet switching noise present in typical transmission link systems. An embodiment may handle differences between a clean external ground and the on-die ground line. A two stage noise filtering, in both the analog and digital domains, may be implemented, as well as an inter-packet latching scheme for application of calibration codes for impedance matching.

According to an embodiment, an impedance calibration circuit includes a comparator configured to compare voltage levels at an external node REXT and an internal node RINT of the impedance calibration circuit and to generate an output COMPOUT based on the comparison; and respective RC components coupled between the REXT node and a first input of the comparator, and between the RINT node and a second input of the comparator; wherein the RC components are configured for symmetric noise injection into the comparator from a chip ground line to which a programmable resistor at the RINT node is coupled.

Respective capacitive elements of the RC components may be configured for coupling to the chip ground.

The RC components may be configured for filtering noise from a supply coupled to the impedance calibration circuit.

The impedance calibration circuit may further include a filter circuit for filtering calibration codes for a driver impedance.

The filter circuit may include a shift register configured to receive consecutive calibration codes generated in a bi-directional counter based on the output COMPOUT from the comparator, and a digital filter coupled to the shift register and outputting a filtered output to a digital calibration code register for generating a digital calibration code.

The digital filter may include a finite impulse response (FIR) filter.

A sample window and number of taps of the FIR filter may be chosen depending on empirical considerations and mathematical considerations.

The impedance calibration circuit may further include a digital calibration code register configured to apply an inter-packet latching scheme such that a digital calibration code is latched during transmission of each high speed packet.

According to an embodiment, an impedance calibration method includes the steps of using a comparator to compare voltage levels at an external node REXT and an internal node RINT of an impedance calibration circuit and to generate an output COMPOUT based on the comparison; and coupling respective RC components between the REXT node and a first input of the comparator, and between the RINT node and a second input of the comparator; wherein the RC components are configured for symmetric noise injection into the comparator from a chip ground line to which a programmable resistor at the RINT node is coupled.

Respective capacitive elements of the RC components may be configured for coupling to the chip ground.

The RC components may be configured for filtering noise from a supply coupled to the impedance calibration circuit.

The impedance calibration method may further include using a digital filter circuit for digital filtering.

The digital filter circuit may include a shift register configured to receive consecutive calibration codes generated in a bi-directional counter based on the output COMPOUT from the comparator, and a digital filter coupled to the shift register and outputting a filtered output to a digital calibration code register for generating a digital calibration code.

The digital filter may include a finite impulse response (FIR) filter.

A sample window and number of taps of the FIR filter may be chosen depending on empirical considerations and mathematical considerations.

The impedance calibration method may further include a digital calibration code register configured to apply an inter-packet latching scheme such that a digital calibration code is latched during transmission of each high speed packet.

According to an embodiment, a device includes an impedance calibration circuit; a comparator configured to compare voltage levels at an external node REXT and an internal node RINT of the impedance calibration circuit and to generate an output COMPOUT based on the comparison; and respective RC components coupled between the REXT node and a first input of the comparator, and between the RINT node and a second input of the comparator; wherein the RC components are configured for symmetric noise injection into the comparator from a chip ground line to which a programmable resistor at the RINT node is coupled.

The device may include a transceiver configured for single, Multi-Lane or Multi-Port serial transmission links.

The transmission link may include one or more of a group consisting of USB2.0, USB3.0, M-Phy, MIPI, and DigRF.

According to an embodiment, a transmission link system includes first and second devices, and a transmission link between the first and second devices; wherein the first device, the second device, or both include an impedance calibration circuit; a comparator configured to compare voltage levels at an external node REXT and an internal node RINT of the impedance calibration circuit and to generate an output COMPOUT based on the comparison; and respective RC components coupled between the REXT node and a first input of the comparator, and between the RINT node and a second input of the comparator; wherein the RC components are configured for symmetric noise injection into the comparator from a chip ground line to which a programmable resistor at the RINT node is coupled.

Some portions of the description which follows are explicitly or implicitly presented in terms of algorithms and functional or symbolic representations of operations on data within a computer memory. These algorithmic descriptions and functional or symbolic representations are the means used by those in the data processing field to convey most effectively the substance of their work to others in the field. An algorithm is, here and generally, conceived to be a self-consistent sequence of steps leading to a desired result. The steps are those requiring physical manipulations of physical quantities, such as electrical, magnetic, or optical signals capable of being stored, transferred, combined, compared, and otherwise manipulated.

An embodiment may be implemented as hardware modules. More particular, in the hardware sense, a module is a functional hardware unit designed for use with other components or modules. For example, a module may be implemented using discrete electronic components, or it may form a portion of an entire electronic circuit such as an Application Specific Integrated Circuit (ASIC). Numerous other possibilities may exist. For example, the system may also be implemented as a combination of hardware and software modules.

Figure 3A:
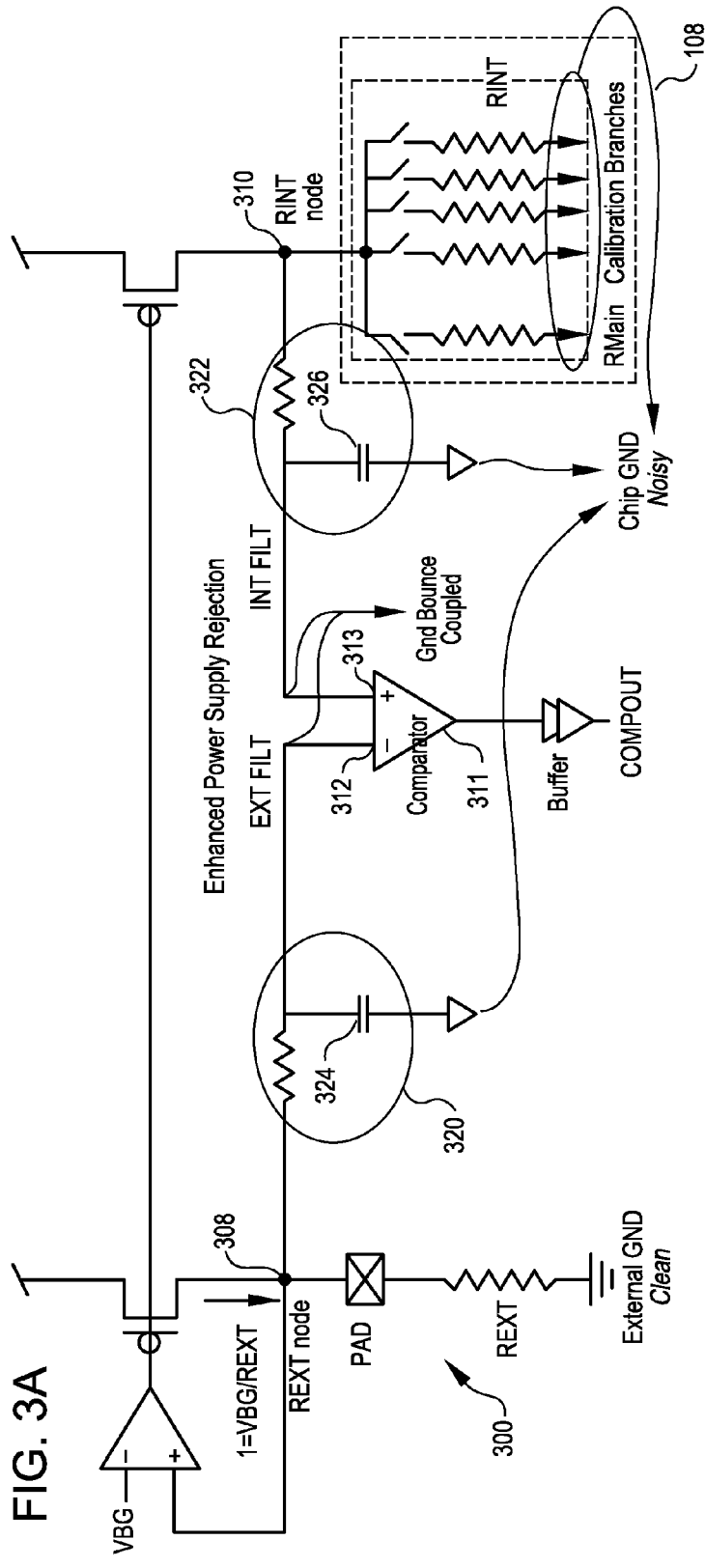
FIGS. 3A to 3C are a schematic diagram of an analog circuit block of an impedance calibration circuit according to an embodiment and respective graphs of a voltage associated with the calibration circuit.

FIG. 3A is a schematic diagram of an analog circuit block 300 of an impedance calibration circuit according to an embodiment.

In the circuit 300, RC circuit components 320, 322 are provided between the REXT node 308 and the comparator's (−) input 312 on the one hand, as well as between the RINT node 310 and the comparator's (+) input 313 on the other hand. As a result, supply noise from $V_{CC}$ is filtered with a low cut-off frequency. In one non-limiting example, a low pass RC filter with R=6.5 kiloohms and C=5 pF may can provide a cut-off frequency of 5 MHz. Such an RC filter may be used for one or both of the RC circuit components 320 and 322.

Additionally, because the capacitive elements 324, 326 of the RC components 320, 322, respectively, are coupled to the chip ground, the chip ground's symmetric noise injection approximately eliminates high-frequency (i.e., noise) variations between the REXT and RINT nodes 308, 310 at the comparator inputs 312, 313. Any voltage signal seen by the comparator 311 having the same polarity on both of its inputs acts as a common mode noise for the comparator 311, and this common mode noise gets rejected due to the high Common Mode Rejection Ratio (CMRR) built into the comparator in a conventional manner.

Figure 4A:
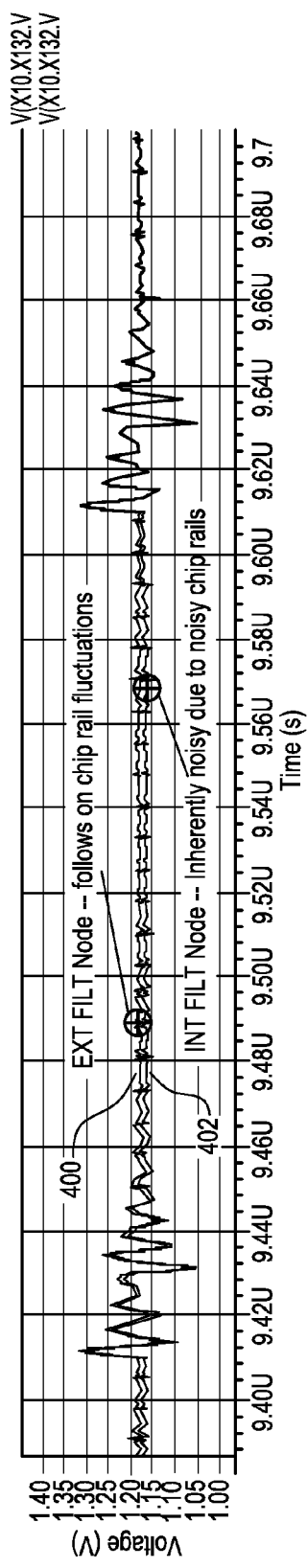
FIGS. 4A to 4D are respective graphs illustrating the noise handling improvement that may be achieved in an embodiment.
Figure 4B:
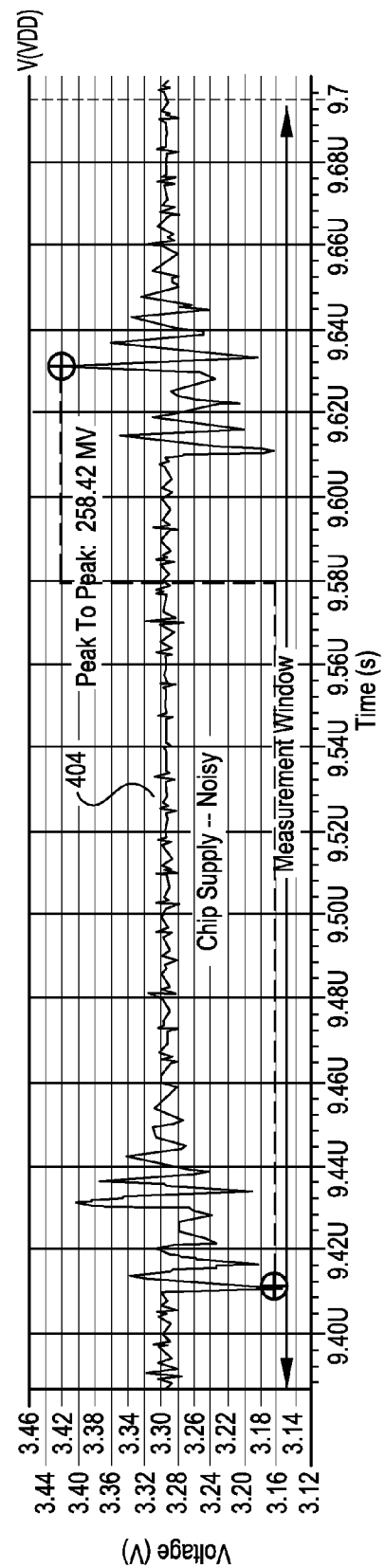
Figure 4C:
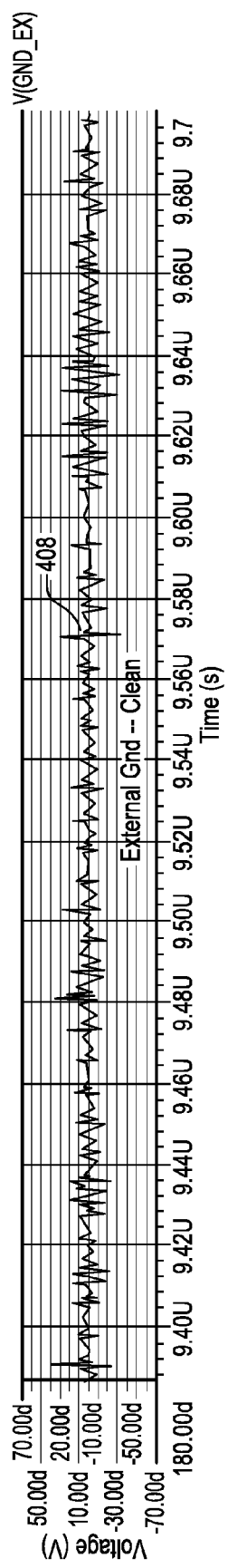
Figure 4D:
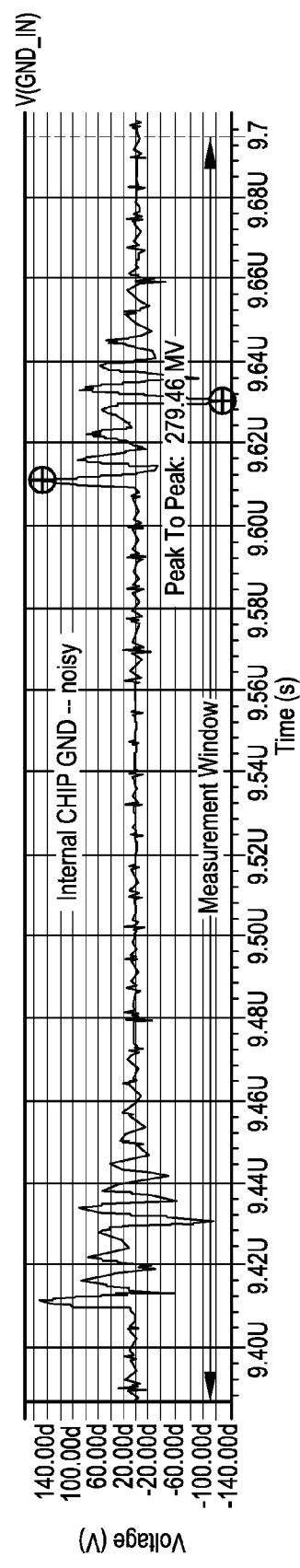

FIGS. 4A-4D are respective graphs illustrating the noise handling improvement that may be achieved in an embodiment. More particularly, FIG. 4A illustrates that the difference of voltages at the internal and external nodes (curves 400, 402 respectively) has been approximately eliminated. That is achieved through substantial filtering of chip supply $V_{cc}$ noise (curve 404) by introduction of RC circuit components 320, 322 and further, due to the symmetric chip ground noise injection which converts noise due to internal ground line bounces to look as a common mode variation that is rejected by the comparator, thus approximately eliminating the noise despite internal and external ground mismatches (compare curves 406, 408 in FIGS. 4D and 4C). The difference in noise handling is evident through a comparison of curves 400, 402 in FIG. 4A on the one hand, and curves 200, 202 in FIG. 2A on the other hand.

Figure 3B:
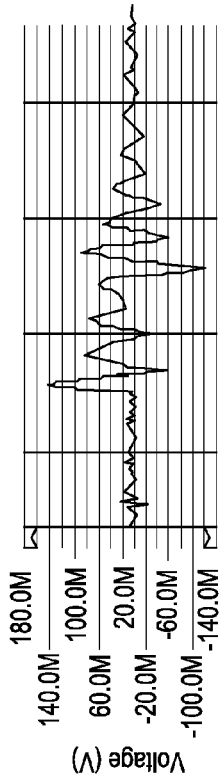
Figure 3C:
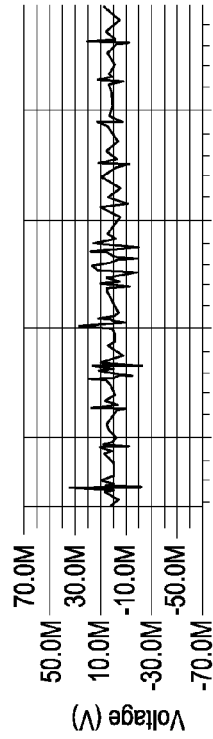
Figure 5:
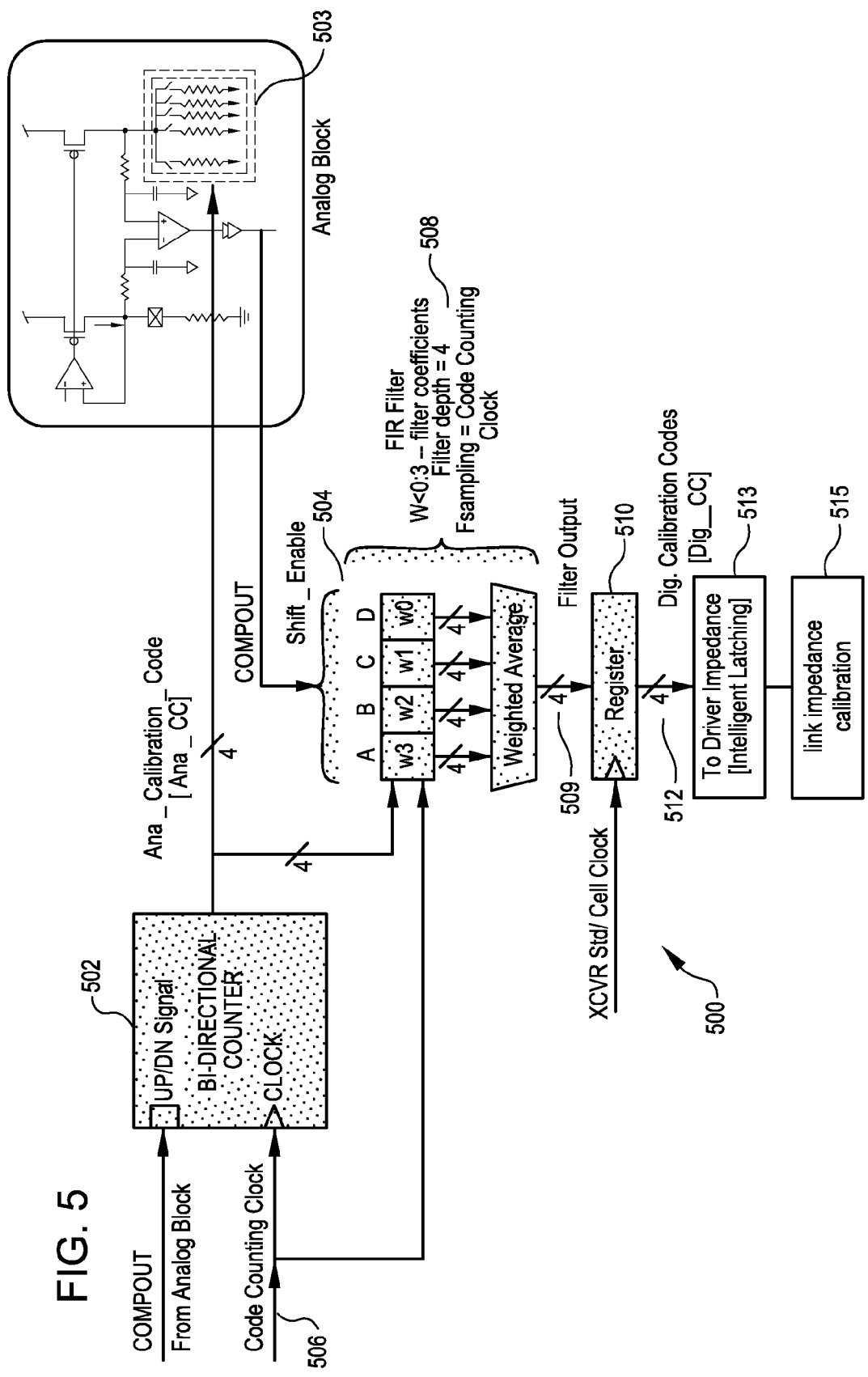
FIG. 5 is a schematic diagram of a digital calibration block of an impedance calibration circuit according to an embodiment.

FIG. 5 is a schematic diagram of a digital calibration block 500 according to an embodiment. The COMPOUT output from the comparator 311 (FIG. 3) is provided to a bi-directional counter 502 as a counting direction signal, as well as to a shift register 504 as a shift-enable signal. In an embodiment, a four element (A to D) shift register 504 is implemented; however, an embodiment is not limited to that level number. The calibration code output (Ana_CC) from the bi-directional counter 502 is provided to the RINT impedance calibration unit 503 and as an input into the shift register 504. A code counting clock signal 506 is provided as a clock signal to both the bi-directional counter 502, and the shift register 504.

A finite impulse response (FIR) filter 508 is implemented in conjunction with the shift register 504, in an embodiment with a filter depth of 4. A weighted average is provided as the filter output 509 into the calibration code register 510 for generating the calibration codes (Dig_CC) 512, which are then latched onto the final driver impedance employing an inter-packet calibration code latching scheme, which will be described in more detail below. The latching scheme/logic is implemented by another digital block 513 in an embodiment, including, inter alia, combinational logic and registers. The calibration codes (Ana_CC) are applied to the RINT impedance calibration unit 503, but not the final transmission link impedance calibration unit 515. Once calibration is complete, Ana_CC keeps oscillating between two adjacent values (say 5 & 6), which, after filtering, is seen as a constant code (the lower one in this case is −5). This filtered code synchronized to the clock is the calibration code Dig_CC which is applied to the driver impedance calibration unit 515 after going through the latching scheme/logic in an embodiment.

FIGS. 6A-6E illustrate the digital filtering according to an embodiment. More particularly, with reference to FIG. 6A, illustrating a noisy supply profile, FIG. 6B illustrating a cell clock signal, and FIG. 6C illustrating the pre-filter code stream. As a result of a noise event 600, the pre-filter code stream (curve 602) is disturbed, resulting in a jump from code "8" at 604 to code "11" at 606. This is followed by a settling period back to an alternating code "8", code "7" state characteristic of the bi-directional counting.

On the other hand, as may be seen from FIGS. 6D and 6E, the digital filtering employed in an embodiment may reduce and even avoid the disturbance by implementing FIR digital filtering with a sliding window of four samples and six samples respectively. Here, all filter coefficients were set to be equal for a simple averaging over the sliding window, however, it will be appreciated that the filter coefficients may be adjusted according to requirements. In selecting the number of taps and the sampling window, hardware overheads and speed may be balanced in the choice of implementation in an embodiment.

The digital filtering in an embodiment may be guided by design policies including, but not limited to:
- implementation as a FIR filter
- anti-alias filter, realized in the analog domain as the RC filter components with a low cut-off frequency.
- cut-off frequency for FIR filter: determined by folding the noise spectrum to eliminate extraneous noise peaks present in supply/ground spectrum.
- number of taps for the FIR filter depends upon
  - empirically
    - peak deviation of calibration codes due to switching noise.
  - mathematically
    - number of taps required to obtain steep-enough roll-off rate to accommodate cut-off frequency within sampling frequency/2 obtained from folding spectra.

In an embodiment, an inter-packet latching scheme is employed during inter-packet delay, i.e., when the high speed transmitters and receivers are off. In that scheme, no switching of the calibration code occurs during high speed packet transmission, but only during the idle state between high speed packets, for example in a burst mode transmission.

Figure 7A:
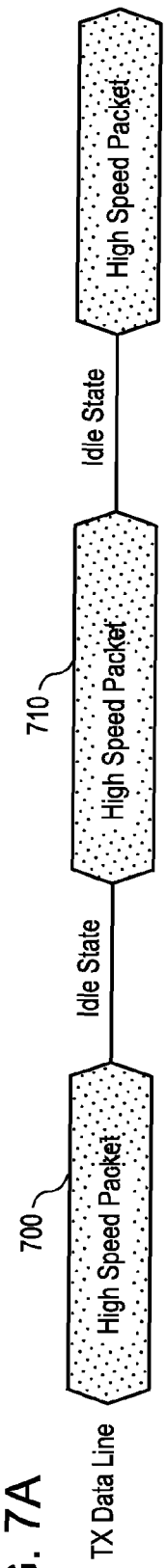
FIGS. 7A to 7D are timing diagrams that illustrate inter-packet latching of calibration codes according to an embodiment.
Figure 7B:
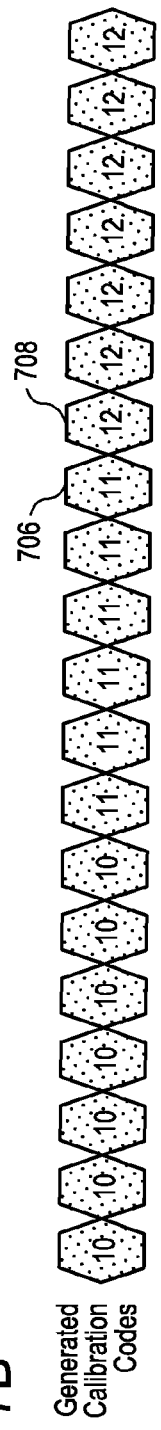
Figure 7C:
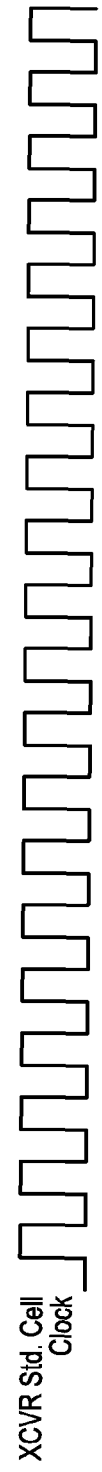

With reference to FIGS. 7A-7D, during high-speed packet transmission e.g., 700, the generated calibration code is latched, e.g., 702, instead of allowing switching of the calibration code based directly on the generated calibration codes (FIG. 7B) triggered by the code counting clock signal (FIG. 7C).

Figure 7D:
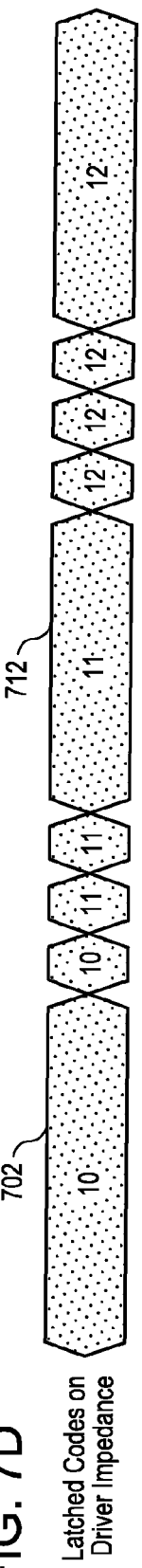

As a result, switching of the calibration code during high speed packet transmission may be avoided, as may otherwise occur as illustrated in the transition from code "11" at 706 to code "12" at 708 during a high speed packet burst 710. In contrast, code "11" at 712 is latched during the entire burst 710, in the inter-packet latching scheme according to an embodiment (FIG. 7D).

An embodiment may provide a dynamic impedance calibration scheme with two-level filtering, and a design methodology for determining filter design specifications at both levels. An embodiment may provide noise-immunity against one or more of ground bounces induced from IP current consumption profiles, ground differences between external precise resistor ground and internal SoC ground line, periodic noise induced due to PLLs, clock buffers, crow-bar switching in data paths, etc., packet start/stop noise in burst mode transmission schemes, where heavy current switching occurs during fast power-up of TX lanes. Furthermore, the inter-packet latching mechanism of codes onto final driver impedance may prevent transitory bumps during packet transmission.

FIGS. 8A-8B show comparative results for the characteristic impedance $Z_{OH}$ variation for dynamic calibration according to a conventional scheme, compared to a scheme according to an embodiment. More particularly, for noise events 802, 804 on an internal chip ground (FIG. 8A), the variation in an embodiment (curve 806) is significantly reduced as compared to the conventional scheme (curve 808).

FIGS. 9A-9B show comparative results for the reflection coefficient $r=(ZL-Z)/(ZL+Z0)$ according to a conventional scheme, compared to a scheme according to an embodiment. More particularly, for noise events 902, 904 on an internal chip ground (FIG. 9A), the variation in an embodiment (curve 906) is significantly reduced as compared to the conventional scheme (curve 908).

Applications of one or more embodiments may be in calibration circuits intended for use in single or Multi-Lane Serial Transmission links involving driver impedance matching to transmission links between devices. Examples for such links include, but are not limited to, USB2.0, USB3.0, M-Phy, MIPI, DigRF, etc.

Figure 10:
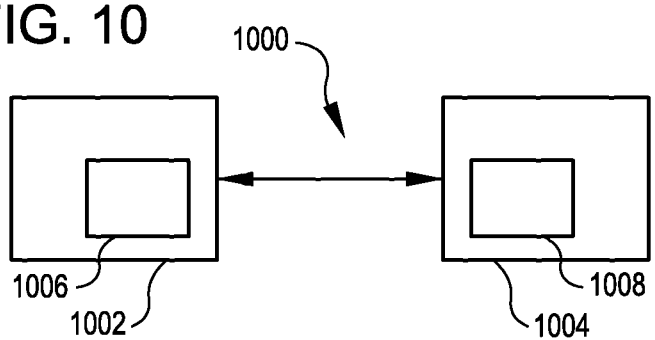
FIG. 10 is a block diagram of a transmission link between a computing device and a peripheral device, according to an embodiment.

FIG. 10 is a schematic diagram of a transmission link system 1000 between a computing device 1002, for example in the form of a laptop computer or tablet personal computer, and a peripheral device 1004, for example in the form of a printer or camera. The computing device 1002, the peripheral device 1004, or both, include respective driver impedance matching circuits 1006, 1008 according to one or more embodiments. Either one or both of the computing devices 1000 and 1002 may include a controller such as a processor.

Figure 11:
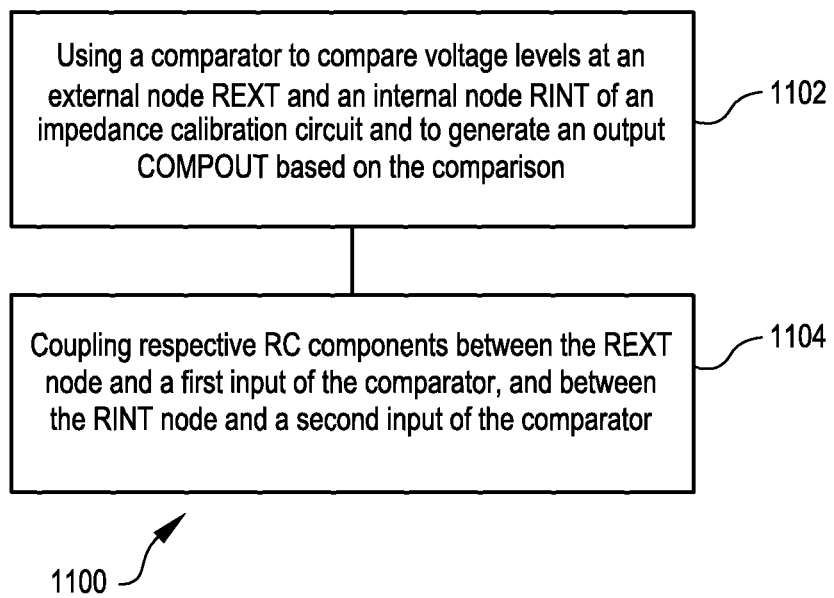
FIG. 11 is a flow chart of an impedance calibration method according to an embodiment.

FIG. 11 is a flow chart 1100 illustrating an impedance calibration method according to an embodiment. At step 1102, a comparator is used to compare voltage levels at an external node REXT and an internal node RINT of an impedance calibration circuit and to generate an output COMPOUT based on the comparison. At step 1104, respective RC components are coupled between the REXT node and a first input of the comparator, and between the RINT node and a second input of the comparator, wherein the RC components are configured for symmetric noise injection into the comparator from a chip ground line to which a programmable resistor at the RINT node is coupled.

One or more embodiments may have a number of features and performance improvements, including:
Signal Integrity Perspective
Highly accurate characteristic impedance calibration even in presence of a noisy environment plebian in Multi-Lane or Multi-Port set-ups.
Avoiding periodic deterministic jitter appearing on data due to deterministic noise-induced code shifts.
Reflection and other transmission losses may be minimized to negligible levels by avoiding transitory mismatches in driver impedance ($Z_{OH}$) and transmission link impedance ($Z_L$)
Keeping integrated signal intensity (ISI) effects under control
Preventing eye degradation.
Intelligent Latching to prevent transitory jumps in $Z_{OH}$ during packet transmission/reception.
Stabilizing driver voltage ($V_{OH}$) levels during packet transmission enhanced vertical eye opening.
Two-stage filtering may sieve out deterministic and random noise from supply/ground from transmit data.
Improved signal integrity at escalating Multi-Gbps datarates
Performance Perspective
Improved EYE diagram obtained with tightly controlled reflections may lead to following design specifications being significantly relaxed.
Lesser constraints on:
TX Pre-Emphasis
Relaxation of pre-emphasis on TX side to counter precursor/post-cursor ISI. Reduced Area/Power Overhead.
$V_{OH}$ Levels may automatically adjust to specifications with accurately aligned output impedance. May eliminate extra-current injection to maintain VOH specifications. Reduced power
RX-Equalization
Improved vertical Eye Opening relaxes equalization on receiver end to open the incoming eye.
Elimination of Inductive Equalization in certain cases.
Lesser overhead for inductive implementation. Reduced power consumption (active/passive implementation) and reduced area (passive Implementation)
Jitter Budgeting
Decreased ISI allows more room for jitter budget allocation to XCVR sub-blocks
Primarily transceiver jitter budget relaxation, may reduce power significantly.
Relaxed data dispute jitter (DDJ) at clock data recovery (CDR) input, may provide drastic improvement in robustness.
Supply Merging; Reduced Pin Count/Less Bypass Decoupling Capacitor/Ease of Packaging
With extensive filtering in calibration block, calibration supply may be merged with XCVR supplies without extra measures of Double-Wire Bonding/Star-Routing and in extreme cases different Supply Pin (esp. in Multi-Lane or Multi-Port environment with uncontrolled noise on power rails).
May ease packaging constraints at system-on-chip (SoC) level, reduces bypass decoupling capacitor area requirement.

From the foregoing it will be appreciated that, although one or more specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A circuit, comprising:
   a driver with an adjustable driver impedance; and
   an impedance calibration circuit, comprising:
      a comparator configured to compare voltage levels at an external node and an internal node of the impedance calibration circuit and to generate an output based on the comparison;
      a programmable resistor coupled between the internal node and a chip ground line; and
      respective resistor and capacitor components coupled between the external node and a first input of the comparator, and between the internal node and a second input of the comparator;
      wherein the resistor and capacitor components are coupled to said chip ground line and configured for symmetric noise injection into the comparator from said chip ground line;
      a counter configured to generate first calibration codes in response to the output for application to control said programmable resistor; and a digital filter circuit configured to filter said first calibration codes to generate second calibration codes for application to control said adjustable driver impedance.

2. The circuit as claimed in claim 1, wherein the resistor and capacitor components are configured for filtering noise from a supply coupled to the impedance calibration circuit.

3. The circuit as claimed in claim 1, wherein the digital filter circuit comprises a shift register configured to receive consecutive first calibration codes, and a digital filter coupled to the shift register and configured to generate a filtered output to a digital calibration code register that generates said second calibration codes.

4. The circuit as claimed in claim 3, wherein the digital filter comprises a finite impulse response (FIR) filter.

5. The circuit as claimed in claim 4, wherein a sample window and number of taps of the FIR filter are chosen depending on empirical considerations and mathematical considerations.

6. The circuit as claimed in claim 3, further comprising said digital calibration code register configured to apply an inter-packet latching scheme such that the second calibration code is latched during packet transmission.

7. A method comprising the steps of:
driving with an adjustable driver impedance;
using a comparator to compare voltage levels at an external node and an internal node of an impedance calibration circuit and to generate an output based on the comparison; and
coupling respective resistor and capacitor components between the external node and a first input of the comparator, and between the internal node and a second input of the comparator;
wherein the resistor and capacitor components are configured for symmetric noise injection into the comparator from a chip ground line to which a programmable resistor at the internal node is coupled;
generating first calibration codes in response to the output for application to control said programmable resistor; and
digital filtering said first calibration codes to generate second calibration codes for application to control said adjustable driver impedance.

8. The method as claimed in claim 7, wherein the resistor and capacitor components are configured for filtering noise from a supply coupled to the impedance calibration circuit.

9. The method as claimed in claim 7, wherein digital filtering comprises shifting consecutive first calibration codes through a shift register, and filtering shifted first calibration codes to generate a filtered output to a digital calibration code register that generates the second digital calibration codes.

10. The method as claimed in claim 9, wherein the digital filter comprises a finite impulse response (FIR) filter.

11. The method as claimed in claim 10, further comprising selecting a sample window and number of taps of the FIR filter depending on empirical considerations and mathematical considerations.

12. The method as claimed in claim 7, further comprising applying an inter-packet latching scheme such that the second calibration code is latched during packet transmission.

13. A device for packet transmission, comprising:
an impedance calibration circuit;
a comparator configured to compare voltage levels at an external node and an internal node of the impedance calibration circuit and to generate an output COMPOUT based on the comparison; and
respective resistor and capacitor components coupled between the external node and a first input of the comparator, and between the internal node and a second input of the comparator;
wherein the resistor and capacitor components are configured for symmetric noise injection into the comparator from a chip ground line to which a programmable resistor at the internal node is coupled; and
a digital calibration code register configured to apply an inter-packet latching scheme such that a digital calibration code generated in response to said output is latched during packet transmission.

14. The device as claimed in claim 13, wherein the device comprises a transceiver configured for single, Multi-Lane or Multi-Port serial transmission links.

15. The device as claimed in claim 14, wherein the transmission link comprises one or more of a group consisting of USB2.0, USB3.0, M-Phy, MIPI, and DigRF.

16. A transmission link system, comprising:
first and second devices engaged in packet transmission, and
a transmission link between the first and second devices;
wherein the first device, the second device, or both comprise
an impedance calibration circuit;
a comparator configured to compare voltage levels at an external node and an internal node of the impedance calibration circuit and to generate an output based on the comparison; and
respective resistor and capacitor components coupled between the external node and a first input of the comparator, and between the internal node and a second input of the comparator;
wherein the resistor and capacitor components are configured for symmetric noise injection into the comparator from a chip ground line to which a programmable resistor at the internal node is coupled; and
a digital calibration code register configured to apply an inter-packet latching scheme such that a digital calibration code generated in response to said output is latched during packet transmission.

17. A method, comprising:
comparing a filtered reference-impedance signal to a filtered feedback signal from a first adjustable impedance; and
controlling an impedance level of the first adjustable impedance in response to the comparing;
wherein controlling the impedance level of the first adjustable impedance includes generating an adjustable-impedance control signal in response to the comparing;
filtering the adjustable-impedance control signal; and
controlling an impedance level of a second adjustable impedance with the filtered adjustable-impedance control signal.

18. The method of claim 17, further including generating the filtered reference-impedance and feedback signals by filtering power-supply noise from reference-impedance and feedback signals.

19. The method of claim 17, further including generating the filtered reference-impedance and feedback signals by rejecting ground noise superimposed on reference-impedance and feedback signals.

20. The method of claim 17 wherein comparing the filtered reference-impedance and feedback signals filters includes comparing a reference-impedance signal to a feedback signal and rejecting a noise signal superimposed on the reference-impedance and feedback signals.

21. The method of claim 17 wherein comparing the filtered reference-impedance and feedback signals filters includes comparing a reference-impedance signal to a feedback signal with a comparator and rejecting a common-mode signal with the comparator.

22. The method of claim 17, further including generating the filtered reference-impedance signal in response to a reference impedance.

23. The method of claim 17, further including controlling an impedance level of a second adjustable impedance in response to the comparing.

24. The method of claim 17, further including controlling an input impedance level of a receiver in response to the comparing.

25. The method of claim 17, further including controlling an output impedance level of a transmitter in response to the comparing.

26. The method of claim 17, further including controlling an input impedance level of a receiver in response to the comparing and only while the receiver is idle.

27. The method of claim 17, further including controlling an output impedance level of a transmitter in response to the comparing and only while the transmitter is idle.

28. The method of claim 17 wherein controlling the impedance level of the first adjustable impedance includes generating an adjustable-impedance control signal in response to the comparing.

29. The method of claim 17 wherein the impedance levels of the first and second adjustable impedances are related by a scale factor.

* * * * *